Feb. 2, 1960 R. K. RICHARDS ET AL 2,923,836

BISTABLE TRANSISTOR CIRCUIT

Filed April 15, 1955

*INVENTORS*
RICHARD K. RICHARDS
THOMAS R. GARRITY
*BY* Alvin J. Riddles
AGENT

United States Patent Office
2,923,836
Patented Feb. 2, 1960

2,923,836

BISTABLE TRANSISTOR CIRCUIT

Richard K. Richards, Poughkeepsie, and Thomas R. Garrity, Wappingers Falls, N.Y., assignors to International Business Machines Corporation, New York, N.Y., a corporation of New York Application April 15, 1955, Serial No. 501,588

11 Claims. (Cl. 307—88.5)

This invention relates to transistor trigger circuits and more particularly to bistable transistor circuits using transistor circuit elements having thyratron like properties and performance.

In U.S. Patent No. 2,889,499, a transistor is described having thyratron like properties and performance. In one embodiment of this transistor an electroformed point contact collector makes high alpha contact with a semi-conductor body containing a P-N junction emitter. This emitter is separated from the point contact collector by a crystal thickness near the average diffusion length of the carriers during the excess carrier lifetime of the semi-conductor. An ohmic base connection is made to the collector surface of the crystal. This transistor has thyratron like properties in that it can be converted from a condition of very low collector current to a condition of very high collector current by a signal of small magnitude and short duration. In addition to the thyratron-like properties, this transistor also exhibits a high degree of sensitivity to light which sensitivity can be employed to recognize a light source as an input signal.

An object of this invention is to provide a high output power, bistable transistor circuit employing thyratron transistors.

Another object of this invention is to provide a high output power bistable transistor circuit employing thyratron transistors triggered by small magnitude and short duration triggering pulses.

Another object of this invention is to provide a high output power bistable transistor circuit employing thyratron transistors that may be triggered by light pulses.

Still another object of this invention is to provide a binary transistor trigger circuit that may be triggered by input pulses or light.

Other objects of the invention will be pointed out in the following description and claims and illustrated in the accompanying drawings, which disclose, by way of example, the principle of the invention and the best mode, which has been contemplated, of applying that principle.

Figure 1:
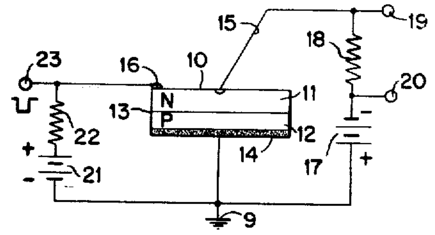
Figure 1 is a typical thyratron transistor circuit.

Referring now to Fig. 1, there is shown an embodiment of a thyratron transistor 10 connected in a circuit to illustrate thyratron performance. In this embodiment, the transistor 10 includes a semi-conductor region 11, arbitrarily shown as N-type, of a thickness which is approximately equal to the average diffusion length of the carriers during the excess carrier lifetime of the semi-conductor material. Adjacent the region 11 is a region 12 of opposite type conductivity, and shown herein as P type conductivity material. This region 12 makes a junction barrier 13 with the region 11 and serves as the emitter of the transistor. An ohmic connection 14 is made to the region 12. On the surface of the region 11 opposite the P region 12 is a high intrinsic alpha collector 15, shown herein as an electroformed point contact although any other high intrinsic alpha collector connection known in the art may be used. The P-N hook is another example of a high intrinsic alpha collector. An ohmic base connection 16 is applied to the region 11 as shown. The transistor 10 may be fabricated by any of the standard practices well known in the art.

The ohmic connection 14 is connected to ground at 9 and a negative potential is applied to the collector 15 by a battery 17 connected at one side to ground and connected at its other side through a resistor 18 to the collector 15. An output signal is developed across the resistor 18 and appears between output terminals 19 and 20. The base region 11 is held positive with respect to the P region 12 through a battery 21, connected at one side to ground and connected at its other side through a resistor 22 to the base connection 16. Negative input signals may be introduced to the transistor at a terminal 23 provided by the base connection.

With the circuit connections as shown in Fig. 1, the N region 11 is held more positive than the P region 12 because of the positive potential applied to the terminal 16 by the battery 21 and the fact that the P region 12 is connected to ground through the ohmic connection 14. These connections also produce a reverse bias on the junction barrier 13 so that no hole current is injected by the P region 12 and the only current flowing in the collector circuit is that supplied from the battery 21 through the base connection 16 and the N-type region to the collector 15. A negative signal applied at terminal 23 changes the potential relationship across the junction barrier 13 by pulling the N region 11 negative with respect to the P region 12 and permits the P region 12 to inject holes which can arrive at the collector 15. These holes, because of the high intrinsic alpha of the electroformed point contact collector, release additional electrons which flow to the base connection 16 and initiate an internal positive feedback condition permitting a large flow of collector current.

Figure 2:
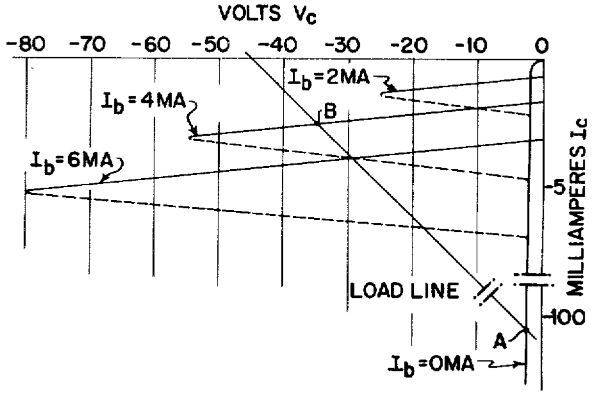
Figure 2 shows the collector characteristic curves of the transistor and circuit of Figure 1.

This situation is represented graphically in Fig. 2 which shows the variation of collector current labelled $I_c$ with collector voltage labelled $V_c$ for values of base current labelled $I_b$. The values of $I_b$ are a function of the potential applied to the N region 11. A load line is shown, the slope of which is determined by the impedance in the collector circuit. In the interest of clarity, the scale of these curves has been expanded in the region of the knees of the curves and the lines are indicated as broken in a region where they approach straight lines. The collector current value at point A is an illustrative value of the output power of this transistor.

The family of collector characteristic curves in Fig. 2 is obtained when the transistor is connected as shown in Fig. 1. In each curve there is little increase in collector current $I_c$ with increases in collector voltage $V_c$ until the reverse bias of the barrier 13 is overcome. When this bias is overcome, the P region 12 injects holes and the internal positive feedback of the transistor results in a heavy flow of collector current.

Figure 4:
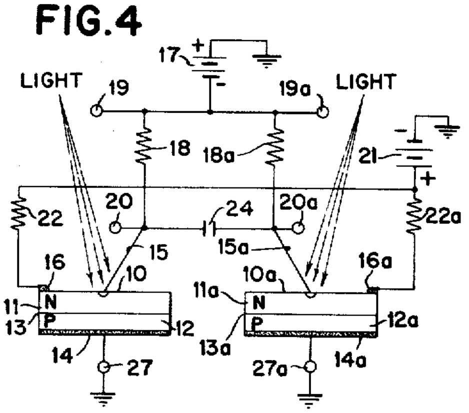
Figure 4 is a diagram of a bistable circuit using thyratron transistors for light triggering.

The reverse bias on the barrier 13 may be overcome either by applying a negative signal to the N region 11 to directly change the potential relationship between the N region 11 and the P region 12 or by directing a light beam on the N region 11 and thereby producing hole-electron pairs in this region. Fig. 4 shows how a light beam is used for reducing bias on the barrier, and the manner in which this is accomplished will be described in detail later. The effect of the application of a negative signal to the N region 11 is to reduce the base current $I_b$. Since the knee of the curve is determined by the base current $I_b$, then a sufficient reduction of the base current effectively moves the operating point, which may be defined as the point of intersection of the load line with the $I_b$ curve, beyond the knee of the $I_b$ curve. This initiates the internal positive feedback action and the circuit moves to the high collector current stable operating point, where the collector current is limited only by the impedance of the collector circuit. This point is shown as point A in Fig. 2. The effect of light falling on the N type region 11 is such that the light produces hole-electron pairs in the N region 11 in such quantity that the reverse bias on the junction barrier 13 is overcome. This in turn permits the P region 12 to inject holes thereby initiating the internal positive feedback mechanism which moves the circuit to the high collector current state indicated by point A in Fig. 2. This effect takes place even though the light strikes the N region 11 at a point distant from the collector beyond the diffusion distance of the carriers in their lifetime and the carriers die out before they can reach the collector 15. The production of hole electron pairs in the region 11 disturbs the thermo-dynamic equilibrium of the semi-conductor crystal because the holes diffuse freely to the P region 12 which due to the geometry of construction is within the carrier lifetime whereas the electrons must take the higher impedance path from terminal 16 through resistor 22 and battery 21. Once the transistor is in a state of high conduction it may be returned to a state of low conduction by reducing the collector potential to a value too low to sustain the internal positive feedback action. If the high state of conduction was obtained by application of a light beam, this beam must be cut off before reducing the collector potential. This is analagous to breaking the plate circuit in a thyratron to reestablish grid control.

The above description of the operation of a thyratron transistor is related to U.S. Patent 2,889,499.

Transistors having these thyratron properties have been found to be capable of being combined into novel and useful high power bistable circuits that can be triggered by either small magnitude and short duration triggering pulses or by light.

Figure 3:
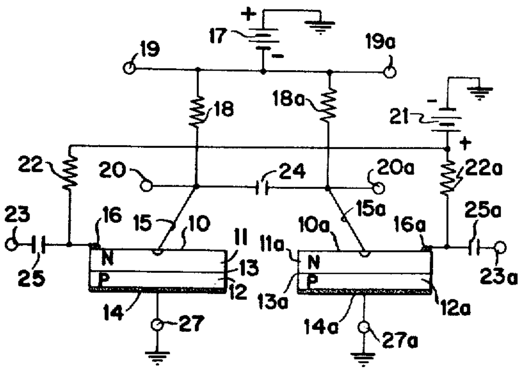
Figure 3 is a diagram of a bistable circuit using thyratron transistors for pulse type triggering.

Referring now to Fig. 3 there is shown a bistable circuit capable of being triggered by electrical pulses wherein two transistors 10 and 10*a*, of the type described above in connection with Figs. 1 and 2, are connected in parallel. The emitter regions of both transistors 10 and 10*a* are connected to ground through connections 14 and 14*a*. Appropriate negative collector potential is applied to collectors 15 and 15*a* through battery 17 and load resistors 18 and 18*a*. The base regions 11 and 11*a* are held positive through battery 21 and resistors 22 and 22*a* connected to base connections 16 and 16*a*. A switching capacitor 24 is provided between collectors 15 and 15*a* to turn off the previously conducting transistor when the circuit changes states, and decoupling capacitors 25 and 25*a* are provided between signal input terminals 23 and 23*a* and base connections 16 and 16*a*. Output signals may be taken between terminals 19, 20 and 19*a*, and 20*a* at opposite ends of the resistors 18, 18*a*.

In operation, one transistor, for example transistor 10, will be conducting and transistor 10*a* will be cut off because the positive potential from battery 21 through resistor 22*a* is holding the N region 11*a* positive with respect to the P region 12*a* and the junction barrier 13*a* is reverse biased. Under these conditions referring to Fig. 2 transistor 10 will be operating at point A and transistor 10*a* will be operating at point B assuming an arbitrary value of $I_b$.

When a signal is received at terminal 23*a* in the form of a negative pulse, the reverse bias of the junction barrier 13*a* is overcome and, through the internal positive feedback action, the collector current of transistor 10*a* moves to the high value indicated by point A in Fig. 2. While transistor 10*a* is cut off, the collector potential at the collector 15*a* is very close to the negative potential of battery 17, whereas, with transistor 10 conducting, the collector potential at collector 15 is much more positive due to the voltage drop across resistor 18. This results in a charge being developed across capacitor 24. When transistor 10*a* goes into conduction, the collector potential at collector 15*a* rises as a heavy current flows through resistor 18*a* and the charge on capacitor 24 drives collector potential of collector 15 sufficiently positive to cut off the internal positive feedback action and permit the positive potential of battery 21 and resistor 22 to reverse bias the junction barrier 13 and cut the transistor 10 off. Referring to Fig. 2 the positive pulse from capacitor 24 effectively reduces $V_c$ permitting the circuit to move up the $I_b=0$ line for the duration of the pulse at which time the circuit moves out the proper $I_b$ line and comes to rest at point B. Subsequent pulses applied alternately to terminals 23 and 23*a* will serve to shift conduction from one transistor to the other. In referring to Fig. 2, it will be observed that by proper selection of biases and impedances it is possible to adjust the operating point nearer the knee of the curve and so adjust the sensitivity of the circuit to input pulse magnitude. Similarly, since the thickness of the "N" region 11 is in the vicinity of the diffusion length during the average lifetime of the excess carriers in the semiconductor material then the duration of turn on time would be the length of time for holes to travel from the junction emitter to the collector 15 which is the carrier lifetime, at a maximum, and it may be considerably reduced by several factors such as by the sweep field in the crystal produced by the negative collector bias and the depth of penetration of the electroforming of collector 15 into crystal 11. These items permit triggering with pulses of small magnitude and short duration. Pulses of 0.5 volt magnitude and 0.1 microsecond duration are illustrative but not limiting values.

When light is used as the trigger signal, as shown in Fig. 4, the circuit is the same as in Fig. 3 with the exception that terminals 23 and 23*a* and decoupling capacitors 25 and 25*a* have been eliminated. The operation is the same as described above, except that the reverse bias is overcome indirectly by employing the photosensitivity of the material itself instead of being overcome directly by changing the potential. The light generates hole electron pairs in the N region of the cut off transistor. The holes diffuse freely to the junction whereas the electrons must take a higher impedance path resulting in a disturbance in the thermal equilibrium of the crystal which reduces the reverse bias on the junction and permits conduction. Once conduction takes place the charge on capacitor 24 will cut off the transistor that had been conducting, as previously described.

Figure 5:
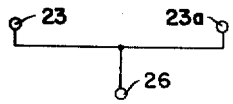
Figure 5 is a diagram of an input for the circuit of Figure 3 to permit binary operation.

The circuit shown in Fig. 3 may be connected for binary operation by connecting terminals 23 and 23*a* together to a common input 26 as shown in Fig. 5. Successive pulses applied to terminal 26 will convert the circuit from one state to another. As each pulse arrives it reduces the potential of both the N regions 11 and 11*a* however the pulse can be effective only on the transistor that is cut-off. This is true because changing the potential of the N region of the conducting transistor serves merely to bias momentarily the junction farther forward and hence has no effect. Once the cut off transistor goes on it will turn off the previously conducting transistor due to the charge on capacitor 24.

Figure 6:
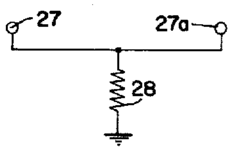
Figure 6 is a diagram of a common emitter resistor input to improve operation.

The operation of the circuit can be improved in two ways. The first of these involves the addition of emitter resistance to prevent simultaneous conduction of both transistors of the triggers. A circuit modification to permit this is shown in Fig. 6. In this case, terminals 27 and 27a in the emitter connections 14, 14a of Fig. 3 are connected through a common resistor 28 to ground instead of directly to ground. The value of resistor 28 is so selected that should both transistors 10 and 10a be conducting the combined current through this resistor would lower the collector potential to a value too low to sustain the internal positive feedback action. This prevents more than one transistor from conducting at the same time. The selection of the value of this resistor 28 could readily be made by anyone skilled in the art. The use of this resistor 28 permits the application of light to both transistors from a single source, not shown in the drawings, wherein both N regions 11 and 11a are illuminated simultaneously and this will serve to cause the circuit to change states. This takes place because the hole electron pairs generated in both crystals 11 and 11a can reduce the reverse bias only on the cut off transistor and they will have no effect on the transistor in high conduction. The construction of the circuit is such that once the cut off transistor begins to conduct, the charge on capacitor 24 in Fig. 4 will shut the other transistor off.

Figure 7:
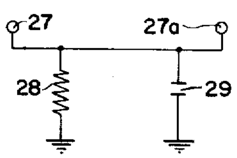
Figure 7 is a diagram of a common emitter input clamp and resistor to improve operation.

The second improvement in the operation of the circuits in Figs. 3 and 4 involves the addition of a clamp to hold the point of common emitter potential constant during the switching operation. This is illustrated in Fig. 7 wherein the clamp is shown as a capacitor 29 which carries a charge while the circuit is in one state of operation equivalent to the voltage drop across resistor 28. When the input signal turns on the cut-off transistor, the emitter potential cannot rise immediately since the capacitor 29 must be charged to the new value of the voltage drop across resistor 28 as a result of the increased current. At the same time, the increase in collector current is applying the charge from capacitor 24 to turn off the previously conducting transistor. Hence, proper selection of the time constant of the network of resistor 28 and capacitor 29 combination, with respect to the switching speed of the circuit, will enable capacitor 29 to hold the point of common emitter potential constant and improve the switching.

While there have been shown and described some preferred embodiments of this circuit other modifications thereof will readily occur to those skilled in the art. For example the thyratron transistor may be made in several variations by one skilled in the art such as reversing the N and P type regions shown, and varying the thickness of the N region by varying the field produced by the collector bias. Therefore the invention should be limited only by the scope of the appended claims.

What is claimed is:

1. A bistable circuit comprising two effectively infinite alpha Thyratron type, internal positive feedback transistors each including a semi-conductor crystal having a junction emitter region, a base region of a thickness near the average diffusion length for excess carriers during the excess carrier lifetime of the semi-conductor material, and a high alpha collector; a point of reference potential; means connecting the junction emitter region of each of said transistors to said point of reference potential; a first source of potential; means connecting the high alpha collector of each of said transistors to said first source of potential, said collector connecting means including individual impedances connected between each of said collectors and said first source of potential; a second source of potential, means connecting said base region of each of said transistors to said second source of potential, the connections of said base regions and said collectors to their respective potential sources being such as to provide a reverse bias on each of said junction emitters; means capacitively interconnecting said collectors; and signal means associated with said transistors and operative to overcome reverse bias on each said junction emitter regions.

2. The bistable circuit of claim 1 wherein said signal means comprises means for directing light pulses on the base regions of said Thyratron type transistors.

3. The bistable circuit of claim 1 wherein said signal means comprises separate means for delivering electrical pulses to the base regions of said Thyratron type transistors for overcoming the reverse bias thereon.

4. A bistable circuit of claim 1 wherein a common resistor is connected between the emitter regions of said Thyratron type transistors and said point of reference potential.

5. The bistable circuit of claim 1 wherein said signal means comprises means for directing light pulses on the base regions of said Thyratron type transistors and a common resistor is connected between the emitter regions of said Thyratron type transistors and said point of reference potential.

6. The bistable circuit of claim 1 wherein said signal means comprises means for delivering electrical pulses to the base regions of said Thyratron type transistors for overcoming the reverse bias thereon, and a common resistor is connected between the emitter regions of said Thyratron type transistors and said point of reference potential.

7. The bistable circuit of claim 1 wherein a capacitor and a resistor are connected in parallel between the emitter regions of said Thyratron type transistors and said point of reference potential.

8. The bistable circuit of claim 1 wherein said high alpha collector comprises an electroformed point contact.

9. The bistable circuit of claim 1 wherein said high alpha collector comprises an electroformed point contact, and a common resistor is connected between the emitter regions of said Thyratron type transistors and said point of reference potential.

10. The bistable circuit of claim 1 wherein said high alpha collector comprises an electroformed point contact, and a capacitor and resistor are connected in parallel between said emitter regions and said point of reference potential.

11. A bistable circuit comprising a first effectively infinite alpha Thyratron type transistor including a first junction emitter, a first N conductivity type base region and a first electroformed point contact collector, means connecting said first emitter to a point of common reference potential, a first biasing resistor, means connecting said first base region to a first terminal of said first biasing resistor, a positive source of potential, means connecting the remaining terminal of said first biasing resistor to said positive source of potential, a first input capacitor, means connecting said base region to a first terminal of said first input capacitor, a first input terminal, means connecting the remaining terminal of said first input capacitor to said first input terminal, a first load resistor, means connecting said first point contact collector to a first terminal of said first load resistor, a negative source of potential, means connecting the remaining terminal of said first load resistor to said source of negative potential, a second effectively infinite alpha Thyratron type transistor including a second junction emitter, a second N conductivity type base region and a second electroformed point contact collector, means connecting said second emitter to said point of common reference potential, a second biasing resistor, means connecting said second base region to a first terminal of said second biasing resistor, means connecting the remaining terminal of said second biasing resistor to said positive source of potential, a second input capacitor, means connecting a first terminal of said second input capacitor to said second base region, a second input terminal, means connecting the remaining terminal of said second input capacitor to said second input terminal, a second load resistor, means connecting said second point contact collector to a first terminal of said second load resistor, means connecting the remaining terminal of said second load resistor to said source of negative potential, a coupling capacitor, means connecting a first terminal of said coupling capacitor to said first point contact collector and means connecting the remaining terminal of said coupling capacitor to said second point contact collector.

References Cited in the file of this patent

UNITED STATES PATENTS

| | | |
|---|---|---|
| 2,059,562 | Curtis et al. | Nov. 3, 1936 |
| 2,623,105 | Shockley et al. | Dec. 23, 1952 |
| 2,641,717 | Toth | June 9, 1953 |
| 2,680,160 | Yaeger | June 1, 1954 |
| 2,702,838 | Haynes | Feb. 22, 1955 |
| 2,709,787 | Kircher | May 31, 1955 |
| 2,728,034 | Kurshan | Dec. 20, 1955 |
| 2,764,642 | Shockley | Sept. 25, 1956 |

FOREIGN PATENTS

| | | |
|---|---|---|
| 158,699 | Australia | Sept. 8, 1954 |
| 511,293 | Belgium | May 31, 1952 |